(12) United States Patent  
Pathayappilly Krishnan et al.

(10) Patent No.: US 12,044,745 B2  
(45) Date of Patent: Jul. 23, 2024

(54) METHOD AND ELECTRONIC DEVICE FOR MANAGING A BATTERY

(71) Applicant: SAMSUNG ELECTRONICS CO., LTD., Suwon-si (KR)

(72) Inventors: Deekshith Pathayappilly Krishnan, Bangalore (IN); Krishnan S Hariharan, Bangalore (IN); Samarth Agarwal, Bangalore (IN); Subramanian Swernath Brahmadathan, Bangalore (IN); Seongho Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 17/846,805

(22) Filed: Jun. 22, 2022

(65) Prior Publication Data  
US 2023/0160969 A1    May 25, 2023

Related U.S. Application Data

(63) Continuation of application No. PCT/KR2022/008140, filed on Jun. 9, 2022.

(30) Foreign Application Priority Data

Nov. 23, 2021    (IN) ............................. 202141053935

(51) Int. Cl.  
*G01R 31/392* (2019.01)  
*H02J 7/00* (2006.01)

(52) U.S. Cl.  
CPC .......... *G01R 31/392* (2019.01); *H02J 7/0048* (2020.01); *H02J 7/005* (2020.01)

(58) Field of Classification Search  
None  
See application file for complete search history.

(56) References Cited

U.S. PATENT DOCUMENTS 7,348,763 B1 *  3/2008  Reinhart ............ H01M 10/443  
                                                          320/150  
8,214,164 B2     7/2012  Gandhi et al.  
(Continued)

FOREIGN PATENT DOCUMENTS

| CN | 104459560 A | 3/2015 |
|---|---|---|
| CN | 109993270 A | 7/2019 |

(Continued)

OTHER PUBLICATIONS

Diao et al., "Algorithm to Determine the Knee Point on Capacity Fade Curves of Lithium-Ion Cells", Jul. 29, 2019, Energies, vol. 12, 9 pages total.

(Continued)

*Primary Examiner* — Jas A Sanghera  
(74) *Attorney, Agent, or Firm* — Sughrue Mion, PLLC

(57) ABSTRACT

A method for managing a battery includes obtaining a first plurality of battery parameters with respect to a first charging or discharging cycle of the battery; obtaining a second plurality of battery parameters with respect to a second charging or discharging cycle of the battery; determining a relative entropy by comparing the first plurality of battery parameters measured during the first charging or discharging cycle and the second plurality of battery parameters measured during the second charging or discharging cycle; and estimating a relative entropy value to predict a number of cycles after which a battery capacity is predicted to drop.

20 Claims, 10 Drawing Sheets

(56) References Cited

U.S. PATENT DOCUMENTS

| 8,901,892 | B2 | 12/2014 | Yazami et al. | |
|---|---|---|---|---|
| 2007/0063675 | A1 | 3/2007 | Walline et al. | |
| 2010/0244846 | A1* | 9/2010 | Desprez | G01R 31/392 |
| | | | | 324/427 |
| 2013/0322488 | A1* | 12/2013 | Yazami | H01M 10/486 |
| | | | | 374/100 |
| 2015/0162768 | A1* | 6/2015 | Okuda | G01R 31/392 |
| | | | | 320/134 |
| 2017/0115355 | A1 | 4/2017 | Willard et al. | |
| 2017/0146608 | A1* | 5/2017 | Lee | G01R 31/3828 |
| 2017/0205466 | A1 | 7/2017 | He et al. | |
| 2021/0080509 | A1 | 3/2021 | Agarwal et al. | |
| 2021/0208208 | A1 | 7/2021 | Yazami | |

FOREIGN PATENT DOCUMENTS

| CN | 113219357 A | 8/2021 |
|---|---|---|
| CN | 112319309 A | 12/2021 |
| KR | 10-1805514 B1 | 12/2017 |
| KR | 10-2021-0003596 A | 1/2021 |
| KR | 10-2021-0031628 A | 3/2021 |

OTHER PUBLICATIONS

Liu, et al., "An analytical model for the CC-CV charge of Li-ion batteries with application to degradation analysis", Jun. 2020, Journal of Energy Storage, vol. 29, 11 pages total.

Hu, et al., "Battery Lifetime Prognostics", Feb. 19, 2020, Joule, vol. 4, 37 pages total.

Cueto, et al., "Identification and machine learning prediction of knee-point and knee-onset in capacity degradation curves of lithium-ion cells", 2020, Energy and AI, vol. 1, 10 pages total.

Sun et al., "Relative Entropy based Lithium-ion Battery Pack Short Circuit Detection for Electric Vehicle", Oct. 11, 2020, IEEE Energy Conversion Congress and Exposition, 7 pages total.

Written Opinion (PCT/ISA/237) dated Sep. 23, 2022 issued by the International Searching Authority in International Application No. PCT/KR2022/008140.

International Search Report (PCT/ISA/210) dated Sep. 23, 2022 issued by the International Searching Authority in International Application No. PCT/KR2022/008140.

Communication issued Oct. 31, 2023 by the Indian Patent Office in Indian Patent Application No. 202141053935.

\* cited by examiner

METHOD AND ELECTRONIC DEVICE FOR MANAGING A BATTERY

CROSS REFERENCE TO RELATED APPLICATION(S)

This application is a continuation of International Application No. PCT/KR2022/008140 designating the United States, filed on Jun. 9, 2022, in the Korean Intellectual Property Receiving Office and claiming priority under 35 U.S.C. § 119(a) to Indian Complete Patent Application No. 202141053935 (CS), filed on Nov. 23, 2021, in the Indian Intellectual Property Office, the disclosures of which are incorporated herein by reference in their entireties.

FIELD

The disclosure relates to a method and an electronic device for managing batteries, and more particularly, to devices using lithium-ion battery like mobile communication gadgets, electric automobiles.

BACKGROUND

Battery management systems are electronic control circuits that monitor and regulate the charging and discharge of batteries. The battery characteristics to be monitored include battery type, voltages, temperature, capacity, state of charge, power consumption, remaining operating time, and charging cycles, as well as other characteristics.

The objective of battery management systems is to ensure the optimal use of the residual energy present in a battery. In order to avoid loading the batteries, battery management systems protect batteries from deep discharge, from overvoltage, which are results of extreme fast charge and extreme high discharge current. In the case of multi-cell batteries, the battery management system also provides for cell balancing function, to manage that different battery cells have the same charging and discharging requirements.

Predicting far in advance a time to abrupt degradation in battery capacity still largely remains beyond the capacity of existing battery management systems. Identifying and exploiting behavioral patterns specific to various battery mechanisms statistically, and using minimal computations on data to make prediction remains an important need.

In addition, the earlier the prediction about the disruption of battery, the better the capability achieved to manage operation of the battery. For example, advance prediction of the time beyond which a battery experiences rapid degradation in its capacity can help in making decisions like scheduling battery change in devices, making optimum use of the duration over which the battery remains healthy, and taking other corrective measures.

Logics that make decisions based on data and that are agnostic to specific battery mechanisms is one way to draw such predictions. However such logic is usually computation intensive. Considering the limited computational power available on board, such logic executes real-time decisions while consuming power more than the limit and accordingly becomes non-operational in case of limited battery power.

Related art battery-management based logic is computational intensive and accordingly not desirable either in terms of time or memory. Further, prediction of sudden disruption is done late since it is comparatively easier to make predictions close to the time of degradation. In other words, the related art methods is capable of only detecting sudden battery depletion when it happens. Yet, such delayed predictions are of less value. Reliance on offline predictions requires a full set of fixed-size data collected over a period of time. Only then is the data deemed sufficient to make decisions.

Still further, other related art methods adaptively predict the health of battery at various instances in future by using the past trends in the data, screen battery based on its life time, and predict sudden death-cycle.

Overall, the related art methods require a suitable artificial intelligence (AI) model and sufficient training data. The parameters adopted for prediction operate within training range only. The prediction accuracy tends to increase with constant learning. The related art prediction methods fail to operate equally well for new and aged battery cells.

SUMMARY

According to an aspect of the disclosure, a method for managing a battery by an electronic device may include: obtaining a first plurality of battery parameters with respect to a first charging or discharging cycle of the battery; obtaining a second plurality of battery parameters with respect to a second charging or discharging cycle of the battery; determining a relative entropy by comparing the first plurality of battery parameters measured during the first charging or discharging cycle and the second plurality of battery parameters measured during the second charging or discharging cycle; and estimating a relative entropy value to predict a number of cycles after which a battery capacity is predicted to drop.

The method may further include generating an assessment result indicative of a health of the battery as a measure of the predicted number of cycles, wherein the health of the battery may include at least one of: a battery lifetime based on the predicted number of cycles after which the battery capacity is predicted to gradually drop; a sudden death of the battery predicted based on the extrapolation of the relative entropy, the sudden death being defined by a predicted severe drop of the battery capacity; an end of life based on a predicted cycle of the battery associated with the SD; and a remaining useful life defined by a difference between the end of life and an ongoing cycle of operation of the battery.

Obtaining the first plurality of battery parameters and obtaining the second plurality of battery parameters may include: charging or discharging the battery for a first time; measuring over different points of charging or discharging time, the first plurality of battery parameters; charging or discharging the battery for a second time; and measuring over different points of charging or discharging time, the second plurality of battery parameters.

Each of the first plurality of battery parameters and the second plurality of battery parameters may include at least one of a current, a voltage, and a resistance.

The estimating may include: inputting the relative entropy value into an extrapolation model; obtaining by the extrapolation model at least one of: a mean value and a slope of relative entropy; a first threshold denoting a nominal transition in the relative entropy from a first linearity to a second linearity based on the mean value and the slope; and a second threshold denoting an abrupt transition in the relative entropy from the second linearity to non-linearity based on the mean value and the slope; and extrapolating a variation-pattern observed within the relative entropy based on the first threshold and the second threshold.

The relative entropy may be determined based on performing at least one of: obtaining a first histogram of the battery capacity of the first charging or discharging cycle;

obtaining a second histogram of the battery capacity of the second charging or discharging cycle; and normalizing the first and second histograms to obtain the relative entropy between the histograms.

The method may further include: identifying within the extrapolated relative entropy one or more of: a first charging-discharging cycle point corresponding to the first threshold to denote a pre-alert about a gradual drop of the battery capacity; and a second charging-discharging cycle point corresponding to the second threshold to denote a danger alert about a severe drop of the battery capacity, the severe drop being defined by a sudden death of the battery.

The first charging or discharging cycle point may correspond to a point of extrapolated relative entropy exceeding the first threshold for a first time.

The second charging or discharging cycle point may correspond to a point of extrapolated relative entropy exceeding the second threshold for a first time.

The predicted number of cycles may be based on a difference between the first charging or discharging cycle point and the second charging or discharging cycle point.

The method may further include outputting a prior alert and a danger alert at time intervals separated by the predicted number of cycles.

The method may further include outputting battery-health alerts periodically or discreetly as at least one of the prior alert and the danger alert.

The method may further include: predicting a life time for the battery based on the predicted number of cycles, and predicting life times for a plurality of applications operating on a power of the battery based on the predicted number of cycles.

The method may further include: classifying the battery as a fresh battery or a used battery based on the predicted number of cycles.

According to an aspect of the disclosure, an electronic device for managing a battery includes: a memory storing instructions; and a processor. The processor executes the instructions and is configured to: obtain a first plurality of battery parameters with respect to a first charging or discharging cycle of the battery; obtain a second plurality of battery parameters with respect to a second charging or discharging cycle of the battery; determine a relative entropy by comparing the first plurality of battery parameters measured during the first charging or discharging cycle and the second plurality of battery parameters measured during the first second charging or discharging cycle; and estimate a relative entropy value to predict a number of cycles after which a battery capacity is predicted to drop.

The processor may be further configured to generate an assessment result indicative of a health of the battery as a measure of the predicted number of cycles, wherein the health of the battery is defined as at least one of: a battery lifetime defined by the predicted number of cycles after which the battery capacity is predicted to gradually drop; a sudden death of the battery predicted based on the extrapolation of the relative entropy, the sudden death being defined by a predicted severe drop of the battery capacity; an end of life defined by a predicted cycle of the battery associated with the sudden death; and a remaining useful life defined by a difference between the end of life and an ongoing cycle of operation of the battery.

The processor may be further configured to measure the first plurality of battery parameters and the second plurality of battery parameters by: charging or discharging the battery for a first time; measuring over different points of charging or discharging time, the first plurality of battery parameters; charging or discharging the battery for a second time; and measuring over different points of charging or discharging time, the second plurality of battery parameters.

Each of the first plurality of battery parameters and the second plurality of battery parameters may include at least one of a current, a voltage, and a resistance.

The processor may be further configured to estimate the relative entropy value by: inputting the relative entropy value into an extrapolation model; obtaining by the extrapolation model at least one of: a mean value and a slope of the relative entropy; a first threshold denoting a nominal transition in the relative entropy from a first linearity to a second linearity based on the mean value and the slope; and a second threshold denoting an abrupt transition in the relative entropy from the second linearity to non-linearity based on the mean value and the slope; and extrapolating a variation-pattern observed within the relative entropy based on the first threshold and the second threshold.

The processor may be further configured to determine the relative entropy by: computing a first histogram of the battery capacity of the first charging or discharging cycle; computing a second histogram of the battery capacity of the second charging or discharging cycle; and normalizing the first and second histograms to compute the relative entropy between the first and second histograms.

The processor may be further configured to: identify within the extrapolated relative entropy at least one of: a first charging or discharging cycle point corresponding to the first threshold to denote a pre-alert about a gradual drop of the battery capacity; and a second charging or discharging cycle point corresponding to the second threshold to denote a danger alert about a severe drop of the battery capacity, the severe drop being defined by the sudden death of the battery.

The first charging or discharging cycle point may correspond to a point of extrapolated relative entropy exceeding the first threshold for a first time.

The second charging or discharging cycle point may correspond to a point of extrapolated relative entropy exceeding the second threshold for a first time.

The predicted number of cycles may be based on a difference between the first charging or discharging cycle point and the second charging or discharging cycle point.

The processor may be further configured to output a prior alert and a danger alert at time intervals separated by the predicted number of cycles.

The processor may be further configured to output battery-health alerts periodically or discreetly as at least one of the prior alert and the danger alert.

The processor may be further configured to: predict a life time for the battery based on the predicted number of cycles, or predict a life time for a plurality of applications operating upon a battery power of the battery based on the predicted number of cycles.

The processor may be further configured to: classify the battery as a fresh battery or a used battery based on the predicted number of cycles.

BRIEF DESCRIPTION OF THE DRAWINGS

The above and other aspects, features, and advantages of certain embodiments of the present disclosure will be more apparent from the following description taken in conjunction with the accompanying drawings, in which.

Figure 1:
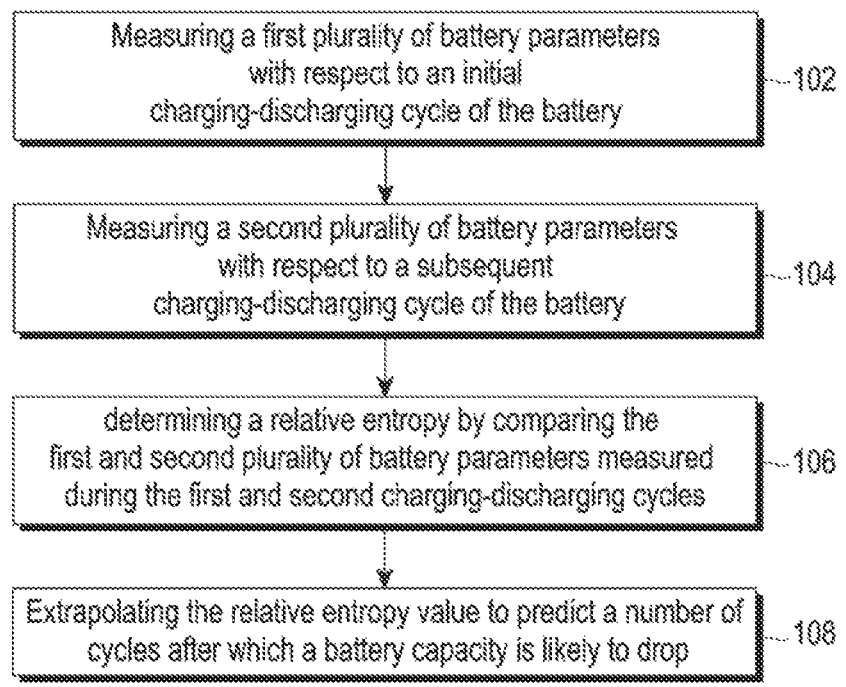
FIG. 1 illustrates a method for managing operation of a battery according to an embodiment of the disclosure.

Further, skilled artisans will appreciate that elements in the drawings are illustrated for simplicity and may not have been necessarily been drawn to scale. For example, the flow charts illustrate the method in terms of the most prominent steps involved to help to improve understanding of aspects of the present invention. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having benefit of the description herein.

DETAILED DESCRIPTION

Embodiments of the disclosure will now be described with reference to the accompanying drawings, wherein like reference numerals refer to like elements throughout. In this regard, embodiments may have different forms and should not be construed as being limited to the descriptions set forth herein.

Reference throughout this specification to "an aspect", "another aspect" or similar language means that a particular feature, structure, or characteristic described in connection with the embodiment is included in at least one embodiment of the present disclosure. Thus, appearances of the phrase "in an embodiment", "in another embodiment" and similar language throughout this specification may, but do not necessarily, all refer to the same embodiment.

The terms "comprises", "comprising", "includes", "including" or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises/includes . . . a" does not, without more constraints, preclude the existence of other devices or other sub-systems or other elements or other structures or other components or additional devices or additional sub-systems or additional elements or additional structures or additional components.

FIG. 1 illustrates a method for managing operation of a battery according to an embodiment of the disclosure.

Referring to FIG. 1, a method for managing operation of a battery includes measuring a first plurality of battery parameters with respect to an initial charging or discharging cycle of the battery (102), and thereafter measuring a second plurality of battery parameters with respect to a subsequent charging or discharging cycle of the battery (104). The first plurality of parameters and the second plurality of battery parameters may be one or more of current, voltage, resistance.

In an embodiment, the measuring of the first plurality of parameters and the second plurality of parameters may include:

i. charging or discharging a battery for a first time period;

ii. measuring over different points of charging or discharging time, the first plurality of battery parameters;

iii. charging or discharging a battery for a second time; and iv. measuring over different points of charging or discharging time, the second plurality of battery parameters.

Further, the method includes determining a relative entropy by comparing the first plurality of parameters measured during the first charging or discharging cycle and the second plurality of battery parameters measured during the second charging-discharging cycle (106). In an embodiment, the relative entropy is determined based on computing a histogram of the battery capacity of the initial charging—discharging cycle and computing another histogram of the battery capacity of the subsequent charging—discharging cycle. The computed histograms are normalized to compute the relative entropy between the histograms.

Further, the method includes extrapolating the relative entropy value to predict a number of cycles after which a battery capacity is likely to drop (108). The extrapolating may include inputting the relative entropy value into an extrapolation model and obtaining by the extrapolation model one or more of: a mean value (theta_0) and a slope (theta_1) of relative entropy; a first threshold (T) denoting a nominal transition in the relative entropy from a first linearity to a second linearity based on the mean value and the slope; and a second threshold (T') denoting an abrupt transition in the relative entropy from the second linearity to non-linearity based on the mean value and the slope.

A variation-pattern observed within the relative-entropy is extrapolated based on the first threshold (T) and the second threshold (T'). Within the extrapolated relative entropy following are ascertained:

a) a first charging-discharging cycle point corresponding to the first threshold (T) to denote a pre-alert about a gradual drop of the battery-capacity, such that the first charging-discharging cycle point corresponds to a point of extrapolated relative entropy exceeding the first threshold (T) for first time.

b) a second charging-discharging cycle point corresponding to the second threshold (T') to denote a danger alert about a severe drop of the battery capacity, the severe drop defined by the sudden death (SD) of the battery. The second charging-discharging cycle point corresponds to a point of extrapolated relative entropy exceeding the second threshold (T') for first time.

The method further includes generating an assessment result indicative of health of the battery as a measure of the predicted number of cycles. The predicted number of cycles is based on a difference between the first charging-discharging cycle point and the second charging-discharging cycle point. A prior alert and a danger alert are output at different time intervals separated by the predicted number of cycles. The prior alert and the danger alert are communicated as battery-health alerts periodically or at discrete time intervals. Based on the predicted number of cycles, the received battery is classified as a fresh or used battery.

In an embodiment, the health of battery may be defined as one or more of: a battery lifetime defined by the predicted number of cycles after which the battery capacity is likely to gradually drop (T); a sudden death (SD) of the battery predicted based on the extrapolation of the relative entropy, the SD defined by a predicted severe drop (T') of the battery capacity; an end of life (EOL) defined by a predicted cycle of the battery associated with the SD; and a remaining useful life (RUL) defined by a difference between EOL and an ongoing cycle of operation of the battery.

As another example, another variant of the health of the battery is defined as predicting life time for a plurality of applications operating upon a battery power of the battery based on the predicted number of cycles.

The embodiments of the present disclosure may provide a self learning parameter free extrapolation method/concept for BMS that does not require any pre-training. The accuracy of prediction is maintained irrespective of measured data being for a fresh or aged battery. Embodiments may be implemented both offline or online, as simple algebraic calculation is required.

Embodiments may provide an extremely efficient and quick pre-screening tool to decide a best battery candidate, and accordingly reduce battery screening time from 6 months to 2 weeks.

Figure 2:
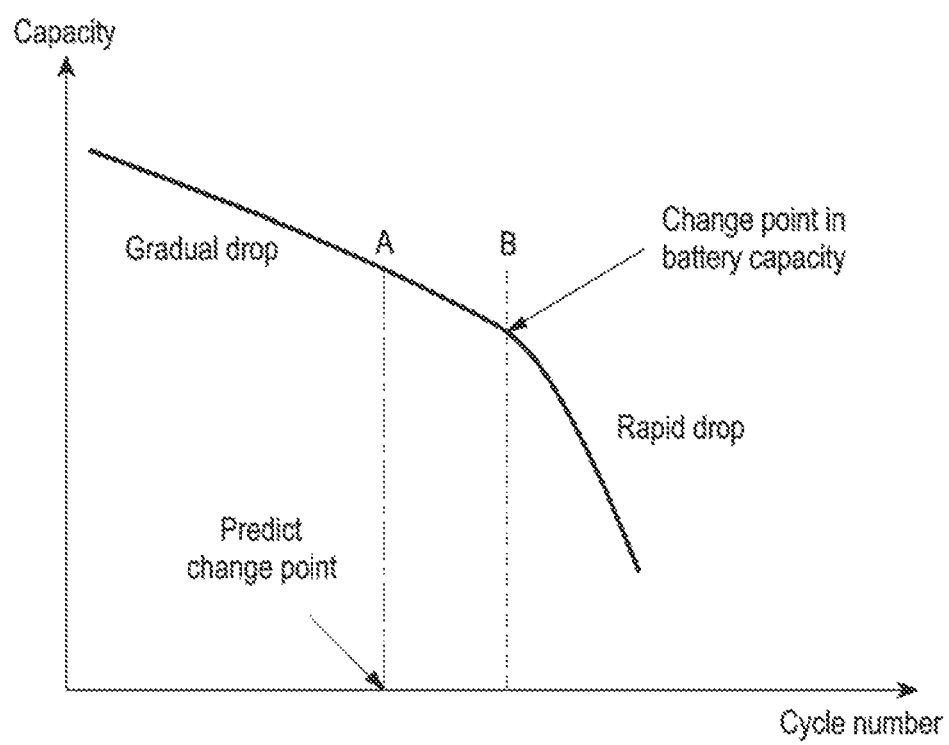
FIG. 2 illustrates an online self-learning BMS to identify sudden death or RUL of the battery.

FIG. 2 illustrates an online self-learning BMS to identify sudden death or RUL of the battery. The self-learning approach uses information in the initial cycles for substantially early prediction of battery health denoted by a time, beyond which a battery undergoes rapid degradation in capacity.

According to an embodiment, the method for battery health assessment includes charging or discharging a battery for a first time, and measuring over different points of charging or discharging time, a plurality of battery parameters (e.g. current, voltage, resistance, etc.). Further, the battery is charged or discharged for the second time as well. Over different-points of charging or discharging time for the second time, a plurality of battery parameters such as current, voltage, resistance, etc. are again obtained. Accordingly, based thereupon, a relative entropy value is obtained by comparing the battery parameters measured during charging or discharging cycles of the first as well as the second time.

The relative entropy value is input to an extrapolation model to determine a number of cycles after which the battery capacity is likely to drop. The number of cycles may be a pair of change points A, B as indicated in FIG. 2, such that the change point A corresponds to an earlier cycle number and change point B corresponds to a subsequent cycle number. Change point A corresponds to a relatively stable state but with an indication that change point B is expected in near future such that the battery may deteriorate rapidly Further, an assessment result indicative of health of the battery is generated as a measure of the determined number of cycles at points A and B.

Figure 3:
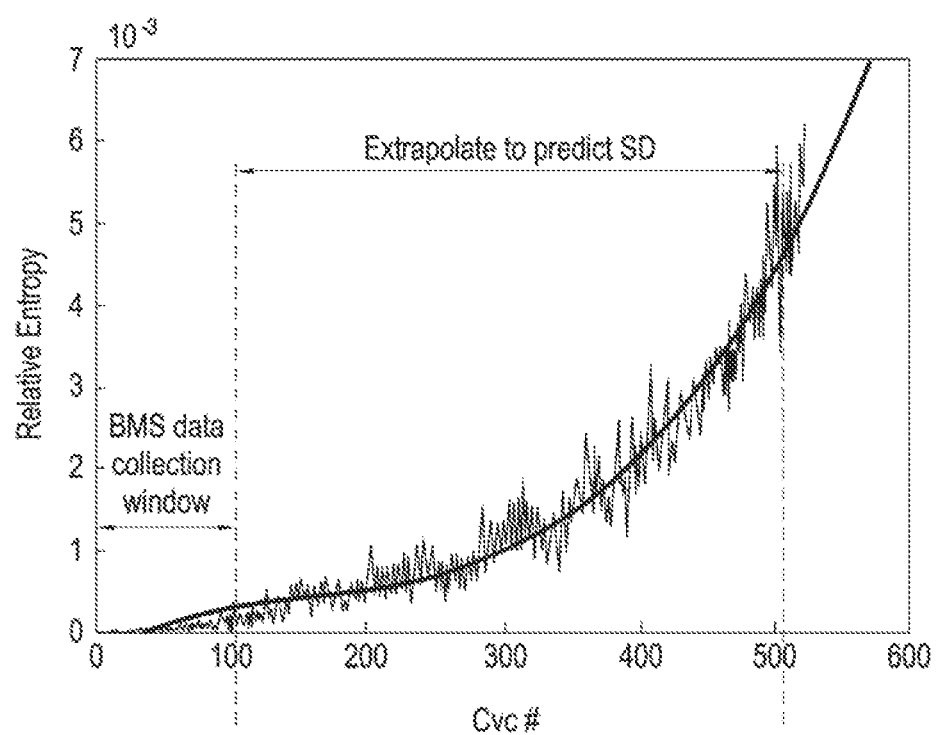
FIG. 3 illustrates an architecture according to an embodiment of the disclosure.

FIG. 3 illustrates an architecture diagram in accordance with an embodiment of the disclosure.

A first module named BMS module corresponding to steps 102 and 104 of FIG. 1 measures capacity vs voltage at two or more (i.e. multiple) cycles as the plurality of battery parameters and corresponds to BMS data collection window.

Figure 4A:
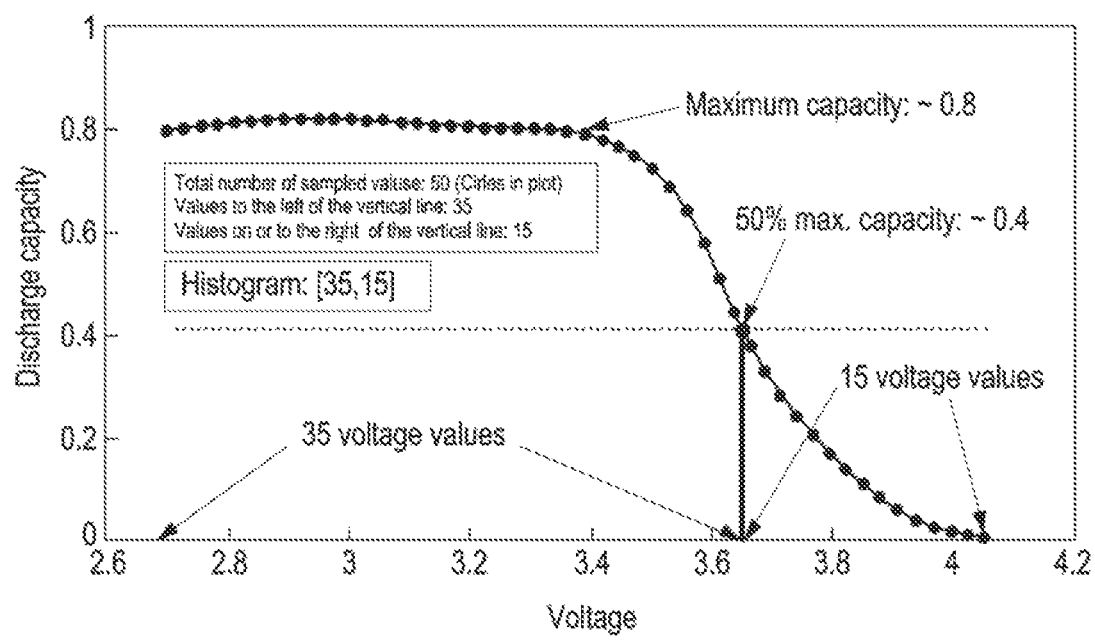
FIGS. 4A and 4B illustrate histogram and relative entropy computation according to an embodiment of the disclosure.
Figure 4B:
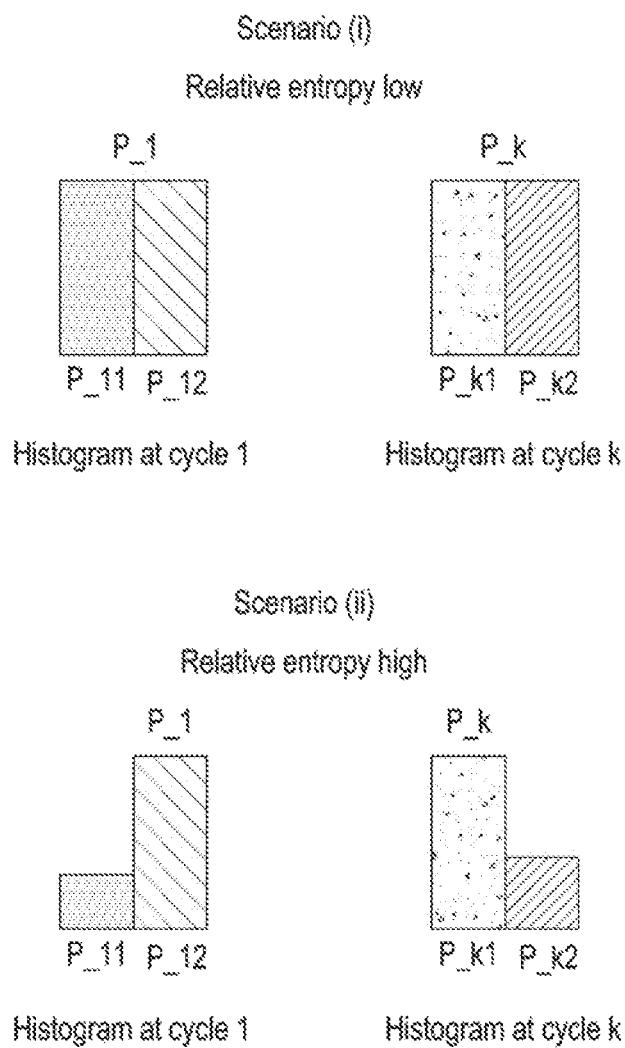

A second module self-learning module or AI enabled module corresponding to steps 108 and 109 of FIG. 1 enables calculation of relative entropy and enables generation of extrapolation curve. Based on the generation of extrapolated curve, a sudden death (SD) or RUL of the battery is predicted FIGS. 4A and 4B illustrates histogram and relative entropy computation in accordance with an embodiment of the disclosure and corresponds to steps 102, 104 and 106. As a prerequisite, data pertaining to the discharge battery capacity over a plurality of cycles is collected. Further, a histogram of the battery capacity of a first cycle is computed followed by computation of histogram of the battery-capacity of each running cycle FIG. 4A illustrates an example histogram computation. For a first cycle, a discharge capacity vector is obtained $Q\_1=(Q\_11, \ldots, Q\_1N)$ and a histogram for the first cycle is denoted as $P\_1$ and may be computed as $P\_1=[P\_11, P\_12]$, which corresponds to fraction of values in $[Q\_\min(1), Q\_\mathrm{mid}(1)]$ and $(Q\_\mathrm{mid}(1), Q\_\max(1)]$, for $Q\_\min(1)<Q\_\mathrm{mid}(1)<Q\_\max(1)$. For each subsequent cycle indexed by "k", further discharge vector is obtained as $Q\_k=(Q\_k1, \ldots, Q\_kN)$. Accordingly, the histogram for cycle k is denoted as $P\_k$ and computed as $P\_k=[P\_k1, P\_k2]$, fractions of values in $[Q\_\min(k), Q\_\mathrm{mid}(k)]$ and $(Q\_\mathrm{mid}(k), Q\_\max(k)]$. Both $P\_1$ and $P\_k$ have been further diagrammatically shown in FIG. 4b, wherein each of $P\_1$ and $P\_k$ may be seen as resolved into sub histograms $P\_11$ and $P\_12$, and $P\_k1$ and $P\_k2$ respectively.

For example, the battery is fully charged and then subject to discharge. It may take about 1 hour to fully discharge. Further, it may be assumed that discharge current and voltage are being measured every 1 minute and accordingly 60 sampled values of capacity v/s voltage may be obtained. The same corresponds to data of any particular cycle.

For any particular cycle, let the 60 discharge current values at 60 time instants T=1 min, T=2 min., ..., T=60 min be $I\_1, I\_2, \ldots I\_60$. Accordingly, the discharge voltages as obtained may be $V\_1, \ldots, V\_60$. Accordingly, a discharge capacity vector of 60 charge values is obtained as $(Q\_1, Q\_2, \ldots, Q\_60)$ which may be computed as $Q\_i=\int_0^t I(t)\,t\,dt$, wherein I(t) denotes and instantaneous current value and t denotes the time instants.

Based on the sampled 60 capacity values, a histogram may be computed for the particular cycle based on a time-instant at which the capacity is $Q\_1/2$. If the capacity is $Q\_1/2$ at time instant k, accordingly then the histogram may be referred as the vector $[k, (60-k)]$.

In the present example as shown in FIG. 4A, a highest capacity is 0.8 and a half capacity corresponds to 0.4. Accordingly, corresponding voltage values separated above and below the half capacity correspond to a histogram of two bins corresponding to 35 and 15.

FIG. 4B illustrates an example computation of relative entropy based on the computed histograms and corresponds to step 106. For such purposes, normalizations of the histograms may be performed as per state of the art mechanisms and thereafter the relative entropy may be computed between the histograms.

Relative entropy is a measure of distance between histograms, and has an increasing trend with cycle number. [0064] [0056] Relative entropy increases linearly until a point and increases exponentially beyond the point. Relative entropy measures how different a given probability distribution is, from a reference probability distribution. The higher the relative-entropy, the larger the difference and vice versa.

The logic in accordance with the present subject matter calculates a probability or histogram from an initial cycle data (i.e. $P\_1$) and fixes that as reference. In each subsequent cycle such as cycle k, the logic similarly computes a probability or histogram (i.e. P_1) for that cycle and compares it with the reference (i.e. P_1) using relative-entropy, to draw inferences.

In FIG. 4B, the relative-entropy "Z_k" may be computed for $k^{th}$ cycle with reference to the first cycle used as reference cycle as follows: Z_k=D(P_k||P_1), where D(P_k||P_1)=P_k(1) log (P_k(1)/P_1(1))+P_k(2) log (P_k(2)/P_1(2))

As may be seen from Scenario (i) in FIG. 4A, a case of low relative-entropy (Z_k=LOW) has been depicted wherein the histogram are same and D(P_k||P_1) is low. As may be seen from Scenario (ii) in FIG. 4B, a case of high relative entropy (Z_k=HIGH) has been depicted wherein the histograms are substantially different and D(P_k||P_1) is HIGH.

As will be understood, relative entropy is computed from the battery discharge voltage at 50% of its maximum capacity. Maximum capacity drops with aging. Relative entropy increases with aging in a similar manner. While the value of relative entropy is calculated from a battery voltage, the change in relative entropy is mapped to capacity-drop.

Figure 5:
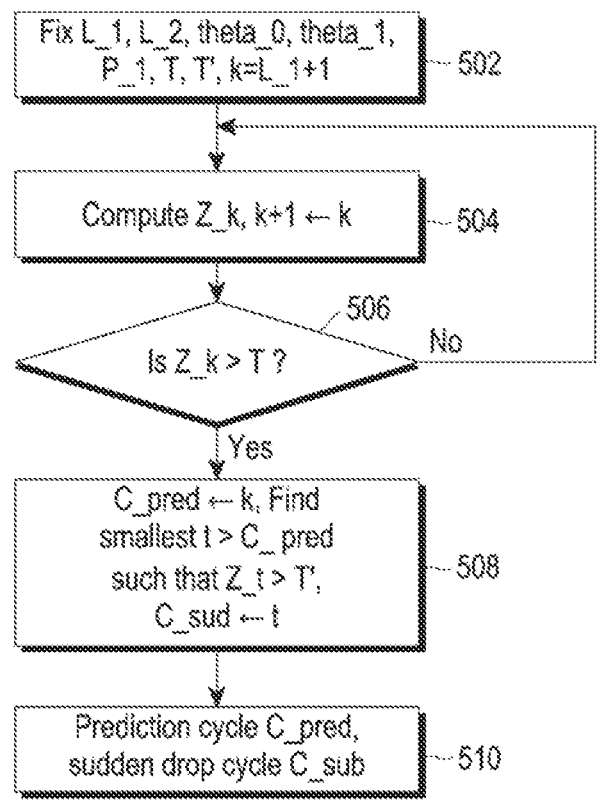
FIG. 5 illustrates computation of extrapolation for the relative entropy according to an embodiment of the disclosure.

FIG. 5 is a flow diagram of a computation of extrapolation for the relative entropy as obtained through the description of FIGS. 4A and 4B and corresponds to step 108.

At step 502, subsequent to calculation of relative entropy Z_k, the first L cycles are considered such that L may be fixed appropriately, say L=10. Thereafter, the mean value of relative entropy in first L cycles is identified and may be referred as m_L. Thereafter, the slope may be fixed as a_1=m_L/100, a_2=10*a_1. A threshold is set based on the parameters a_1 and a_2.

In other example calculation for step 502, For L_1>L_2 chosen appropriately within the first L cycles, theta_0 is fixed as mean value of the Z_k, for k=1, . . . , L_1 and corresponds to m_L. Thereafter, theta_1 is computed as slope of Z_k values with respect to k, for k=L_2 to L_1 fix a value T based on theta_0, theta_1.

At step 504, the relative entropy Z_k calculated for the $k^{th}$ cycle is extrapolated to k+1 cycle based on the step 502. Overall, the extrapolated relative entropy corresponds to scaled and shifted relative entropy At step 506, the extrapolated Z_k is compared against the threshold value T as computed in step 504. If Z_k>T, then the control flows to step 508, else further extrapolation is done according to step 504.

At step 508, the first time appropriately scaled and shifted relative entropy crosses the threshold is detected. The cycle C_pred is found for which Z_k goes above T for the first time as depicted in step 506

At step 510, using the linearity of increase in Z_k, the cycle C_sud is found at which Z_k crosses T' for the first time. T' in turn depends on T and theta_1. C_sud is declared as the sudden drop cycle and a danger alert about the onset of sudden drop is sounded. In an example, a pre-alert may be sounded much prior during the occurrence of the cycle C_pred.

In an example for the aforesaid prediction of T and T', polynomial fit of 1st or 2nd order is used for the initial Relative Entropy data selected until the change point, i.e. until T and T'. The polynomial fit is applied based on Algebraic model with least square error minimization. Estimated polynomial coefficients are plugged into the equation to calculate the SD cycle substantially before SD is encountered. Typically (e.g.) 90 cycles data is needed to predict occurrence of SD at 400 cycles.

Figure 6:
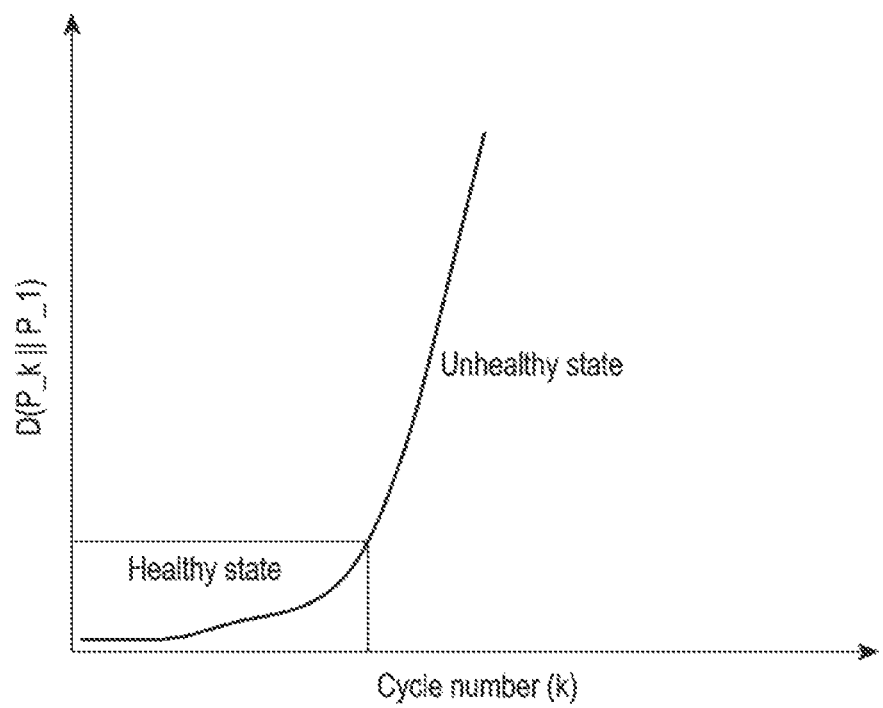
FIG. 6 is a graph showing extrapolated relative-entropy according to an embodiment of the disclosure.

FIG. 6 illustrates extrapolated relative-entropy and corresponds to step 108. As indicated in FIG. 6, D(P_k||P_1) increases at different rates with respect to "k" as the battery ages.

Figure 7A:
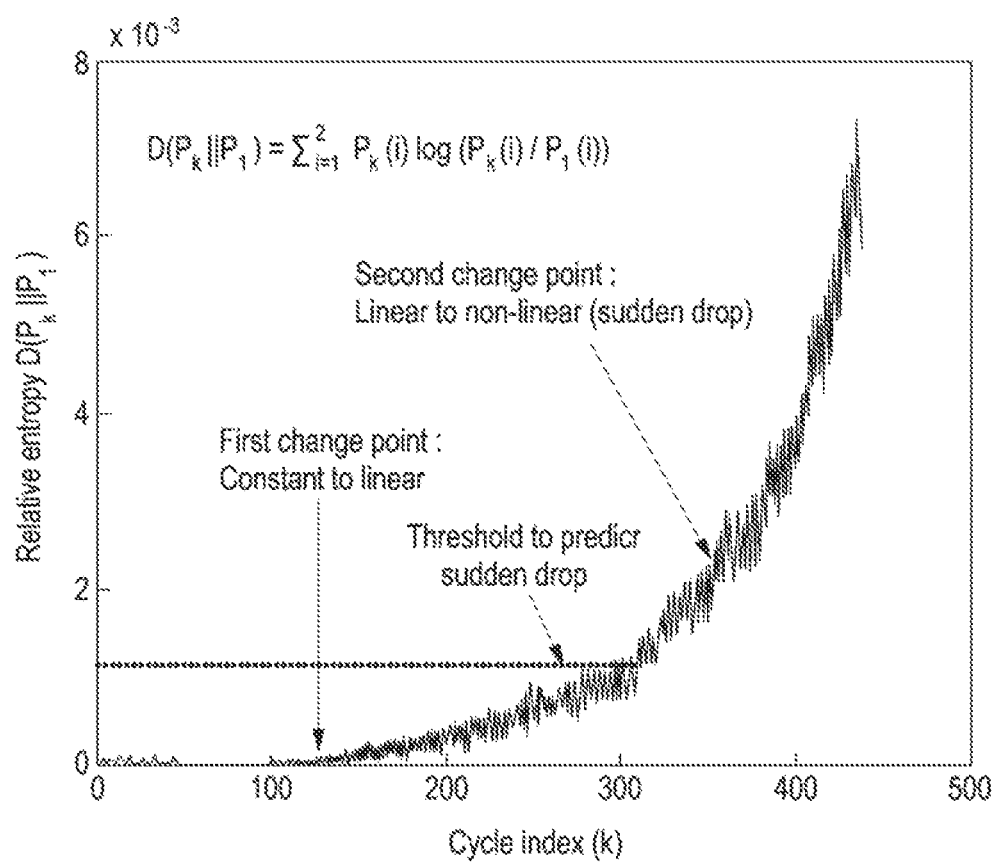
FIGS. 7A and 7B illustrate graphical representation of variation between relative entropy and the cycle index and variation between the discharge capacity and the cycle index.
Figure 7B:
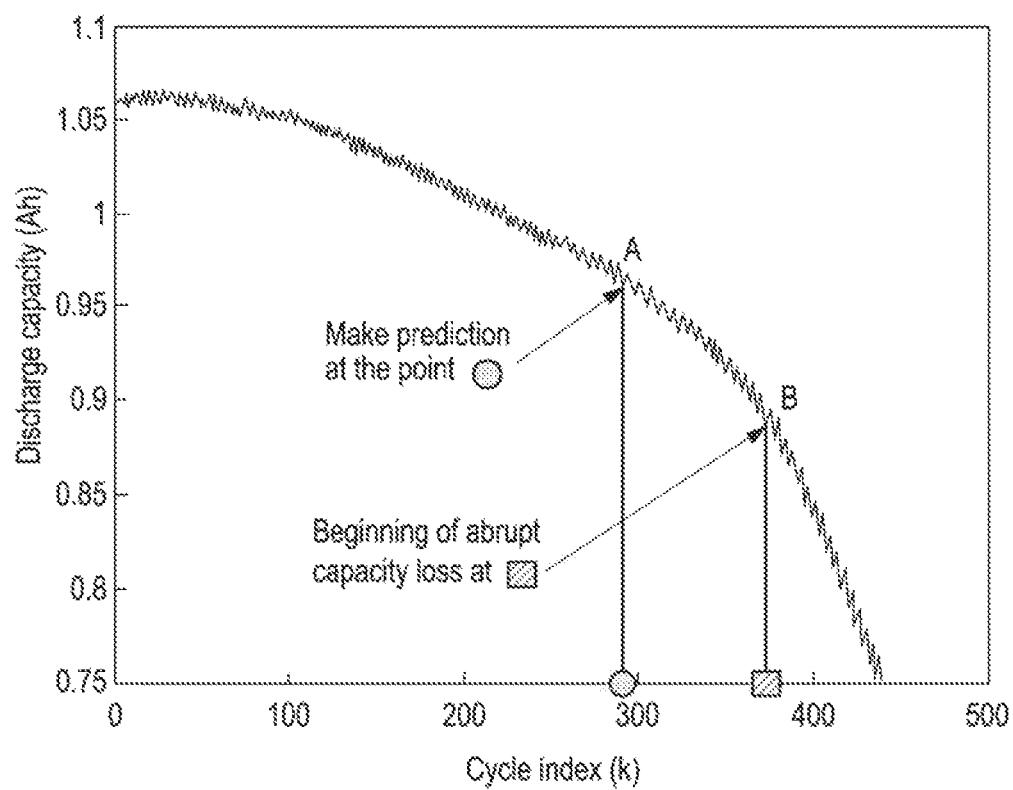

FIG. 7A is a graphical representation of variation between relative entropy and the cycle index and FIG. 7B is a graphical representation of variation between the discharge capacity and the cycle index. The graphical representations in FIGS. 7A and 7B identify the first change point and the second change point as corresponding to C_pred and C_sud respectively.

Accordingly, embodiments may enable knowledge of a battery with algebraic calculations to decide the length of extrapolation interval. Further, the same enables prediction of SD (i.e. C_pred and C_sud) from values of the extrapolated values. In an example, the certain threshold values such T and T' as provided in FIG. 5 imply SD.

Further, extrapolation of relative entropy minimizes the amount of charge/discharge cycles of data necessary to predict C_pred and C_sud. Extrapolation uses minimal computation and is based on simple algebraic equations. Hence, the present subject matter can be implemented online for example through a remote server or a cloud server.

An example table below (i.e. Table 1) provides example data indicative of the performance of the present subject matter.

TABLE 1

| Actual Sud. Drop | Predicted Sud. Drop | #Cycles Ahead |
|---|---|---|
| 380 | 370 | 120 |
| 400 | 395 | 93 |
| 400 | 374 | 131 |
| 360 | 356 | 102 |

As may be observed, a mean error of 12 cycles is observed in prediction. Further, the mean number of cycles before which prediction is made is observed as 113 cycles.

Further, following Table 2 illustrates an example performance comparison between the operation of present subject matter over a fresh and aged battery.

TABLE 2

| Fresh Battery | Aged Battery |
|---|---|
| Monitor battery cycles, sample the voltage and capacity | Monitor battery cycles, sample the voltage and capacity |
| Learn about the state of the battery using certain mathematical constructs (Histogram, Information entropy etc.), w.r.t $1^{st}$ cycle | Learn about the state of the battery using certain mathematical constructs (Histogram, Information entropy etc.), w.r.t $N^{th}$ cycle |
| Continue learning until the sampling cycle (S)-identified from the given cycles, not predetermined or ad-hoc. | Continue learning until the sampling cycle (N to N + S)-identified from the given cycles, not predetermined or ad-hoc. |
| Project the information to future cycles | Project the information to future cycles |
| Identify the Health, EOL and RUL from the projected trend, from $1^{st}$ cycle. | Identify the Health, EOL and RUL from the projected trend, from $N^{th}$ cycle. |

Figure 8:
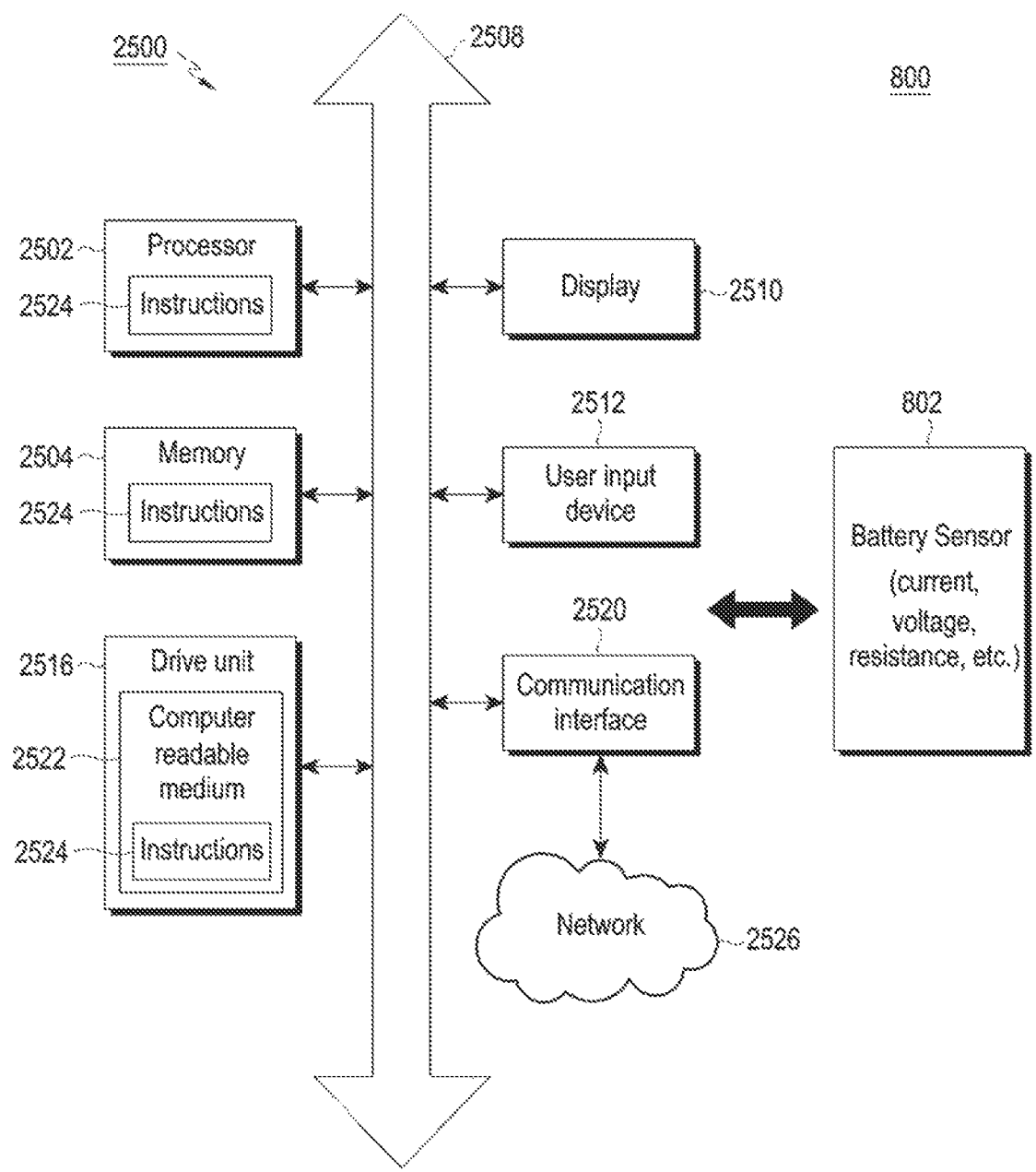
FIG. 8 illustrates yet another exemplary implementation according to an embodiment of the disclosure.

FIG. 8 illustrates yet another exemplary implementation 800 according to an embodiment, and yet another hardware configuration of device in the preceding figures through a network of battery sensors 802 for measuring current, voltage, and resistance with respect to the battery. Further, a computer system 2500 is provided to receive the signals from the sensors 802 and thereafter process the same in accordance with the method steps 102 to 108.

The computer system 2500 can include a set of instructions that can be executed to cause the computer system 2500 to perform any one or more of the methods disclosed. The computer system 2500 may operate as a standalone device or may be connected, e.g., using a network, to other computer systems or peripheral devices.

In a networked deployment, the computer system 2500 may operate as a server or as a client user computer in a server-client user network environment, or as a peer computer system in a peer-to-peer (or distributed) network environment. The computer system 2500 can also be implemented as or incorporated across various devices, such as a personal computer (PC), a tablet PC, a personal digital assistant (PDA), a mobile device, a palmtop computer, a laptop computer, a desktop computer, a communications device, a wireless telephone, a land-line telephone, a web appliance, a network router, switch or bridge, or any other machine capable of executing a set of instructions (sequential or otherwise) that specify actions to be taken by that machine. Further, while a single computer system 2500 is illustrated, the term "system" shall also be taken to include any collection of systems or sub-systems that individually or jointly execute a set, or multiple sets, of instructions to perform one or more computer functions.

The computer system 2500 may include a processor 2502, e.g., a central processing unit (CPU), a graphics processing unit (GPU), or both. The processor 2502 may be a component in a variety of systems. For example, the processor 2502 may be part of a standard personal computer or a workstation. The processor 2502 may be one or more general processors, digital signal processors, application-specific integrated circuits, field-programmable gate arrays, servers, networks, digital circuits, analog circuits, combinations thereof, or other now known or later developed devices for analyzing and processing data. The processor 2502 may implement a software program, such as code generated manually (i.e., programmed).

The computer system 2500 may include a memory 2504, such as a memory 2504 that can communicate via a bus 2508. The memory 2504 may include, but is not limited to computer-readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one example, memory 2504 includes a cache or random access memory for the processor 2502. In alternative examples, the memory 2504 is separate from the processor 2502, such as a cache memory of a processor, the system memory, or other memory. The memory 2504 may be an external storage device or database for storing data. The memory 2504 is operable to store instructions executable by the processor 2502. The functions, acts or tasks illustrated in the figures or described may be performed by the programmed processor 2502 for executing the instructions stored in the memory 2504. The functions, acts or tasks are independent of the particular type of instructions set, storage media, processor or processing strategy and may be performed by software, hardware, integrated circuits, firmware, micro-code and the like, operating alone or in combination. Likewise, processing strategies may include multiprocessing, multitasking, parallel processing and the like.

As shown, the computer system 2500 may or may not further include a display unit 2510, such as a liquid crystal display (LCD), an organic light-emitting diode (OLED), a flat panel display, a solid-state display, a cathode ray tube (CRT), a projector, a printer or other now known or later developed display device for outputting determined information. The display 2510 may act as an interface for the user to see the functioning of the processor 2502, or specifically as an interface with the software stored in the memory 2504 or the drive unit 2516.

Additionally, the computer system 2500 may include an input device 2512 configured to allow a user to interact with any of the components of system 2500. The computer system 2500 may also include a disk or optical drive unit 2516. The disk drive unit 2516 may include a computer-readable medium 2522 in which one or more sets of instructions 2524, e.g. software, can be embedded. Further, the instructions 2524 may embody one or more of the methods or logic as described. In a particular example, the instructions 2524 may reside completely, or at least partially, within the memory 2504 or within the processor 2502 during execution by the computer system 2500.

In some embodiments, the computer system 2500 may further include the battery sensor 802.

Embodiments of the disclosure may include a computer-readable medium that includes instructions 2524 or receives and executes instructions 2524 responsive to a propagated signal so that a device connected to a network 2526 can communicate voice, video, audio, images, or any other data over the network 2526. Further, the instructions 2524 may be transmitted or received over the network 2526 via a communication port or interface 2520 or using a bus 2508. The communication port or interface 2520 may be a part of the processor 2502 or maybe a separate component. The communication port 2520 may be created in software or maybe a physical connection in hardware. The communication port 2520 may be configured to connect with a network 2526, external media, the display 2510, or any other components in system 2500, or combinations thereof. The connection with the network 2526 may be a physical connection, such as a wired Ethernet connection or may be established wirelessly as discussed later. Likewise, the additional connections with other components of the system 2500 may be physical or may be established wirelessly. The network 2526 may alternatively be directly connected to the bus 2508.

The network 2526 may include wired networks, wireless networks, Ethernet AVB networks, or combinations thereof. The wireless network may be a cellular telephone network, an 802.11, 802.16, 802.20, 802.1Q or WiMax network. Further, the network 826 may be a public network, such as the Internet, a private network, such as an intranet, or combinations thereof, and may utilize a variety of networking protocols now available or later developed including, but not limited to TCP/IP based networking protocols. The system is not limited to operation with any particular standards and protocols. For example, standards for Internet and other packet-switched network transmissions (e.g., TCP/IP, UDP/IP, HTML, and HTTP) may be used.

Embodiments provide a self-learning approach that uses information in the initial cycles for very early prediction of battery health denoted by a time, beyond which a battery undergoes rapid degradation in capacity. According to embodiments, the method is model and parameter free and no pre-training is needed. The embodiments operate equally well for any device, from the time of introduction and operates irrespective of new or aged battery.

Embodiments provide a self-learning concept of BMS which monitors the battery data for a limited cycles (Sampling time, <10% of total cycles) and thereby learns the battery state as the data is assimilated every instant. The learning is appropriated to predict the battery health, end of life (EOL) and remaining useful life (RUL) accurately.

Unless otherwise defined, all technical and scientific terms used herein have the same meaning as commonly understood by one of ordinary skill in the art to which this disclosure belongs. The system, methods, and examples provided herein are illustrative only and not intended to be limiting.

While specific language has been used to describe the disclosure, any limitations arising on account of the same are not intended. As would be apparent to a person in the art, various working modifications may be made to the method in order to implement the inventive concept as taught herein.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

Benefits, other advantages, and solutions to problems have been described above with regard to specific embodiments. However, the benefits, advantages, solutions to the problem and any component(s) that may cause any benefit, advantage, or solution to occur or become more pronounced are not to be construed as a critical, required, or essential feature or component of any or all the claims.

What is claimed is:

1. A method for managing a battery by an electronic device, the method comprising:
   obtaining a first plurality of battery parameters with respect to a first charging or discharging cycle of the battery;
   obtaining a second plurality of battery parameters with respect to a second charging or discharging cycle of the battery;
   determining a relative entropy by comparing the first plurality of battery parameters measured during the first charging or discharging cycle and the second plurality of battery parameters measured during the second charging or discharging cycle; and
   predicting a number of cycles after which a battery capacity is predicted to drop based on the determined relative entropy.

2. The method of claim 1, further comprising generating an assessment result indicative of a health of the battery as a measure of the predicted number of cycles, wherein the health of the battery includes at least one of:
   a battery lifetime based on the predicted number of cycles after which the battery capacity is predicted to gradually drop;
   a sudden death of the battery predicted based on the determined relative entropy, the sudden death being defined by a predicted severe drop of the battery capacity;
   an end of life based on a predicted cycle of the battery associated with the sudden death; and
   a remaining useful life defined by a difference between the end of life and an ongoing cycle of operation of the battery.

3. The method of claim 1, wherein the obtaining the first plurality of battery parameters and the obtaining the second plurality of battery parameters comprise:
   charging or discharging the battery for a first time;
   measuring over different points of charging or discharging time, the first plurality of battery parameters;
   charging or discharging the battery for a second time; and
   measuring over different points of charging or discharging time, the second plurality of battery parameters, and
   wherein each of the first plurality of battery parameters and the second plurality of battery parameters comprises at least one of a current, a voltage, and a resistance.

4. The method of claim 1, wherein the predicting further comprises:
   inputting a value corresponding to the relative entropy into an extrapolation model;
   obtaining by the extrapolation model at least one of:
      a mean value and a slope of relative entropy;
      a first threshold denoting a nominal transition in the relative entropy from a first linearity to a second linearity based on the mean value and the slope; and
      a second threshold denoting an abrupt transition in the relative entropy from the second linearity to non-linearity based on the mean value and the slope; and
   extrapolating a variation-pattern observed within the relative entropy based on the first threshold and the second threshold.

5. The method of claim 4, wherein the determining the relative entropy further comprises performing at least one of:
   obtaining a first histogram of the battery capacity of the first charging or discharging cycle;
   obtaining a second histogram of the battery capacity of the second charging or discharging cycle; and
   normalizing the first histogram and the second histogram to obtain the relative entropy between the first histogram and the second histogram.

6. The method of claim 4, further comprising:
   identifying within the extrapolated variation pattern at least one of:
      a first charging-discharging cycle point corresponding to the first threshold to denote a pre-alert about a gradual drop of the battery capacity; and
      a second charging-discharging cycle point corresponding to the second threshold to denote a danger alert about a severe drop of the battery capacity, the severe drop being defined by a sudden death of the battery.

7. The method of claim 6, wherein the first charging or discharging cycle point corresponds to a point of extrapolated relative entropy exceeding the first threshold for a first time,
   wherein the second charging or discharging cycle point corresponds to a point of extrapolated relative entropy exceeding the second threshold for a first time, and
   wherein the predicted number of cycles is based on a difference between the first charging or discharging cycle point and the second charging or discharging cycle point.

8. The method of claim 1, further comprising outputting a prior alert and a danger alert at time intervals separated by the predicted number of cycles.

9. The method of claim 8, further comprising at least one of:
predicting a life time for the battery based on the predicted number of cycles, and
predicting life times for a plurality of applications operating on a power of the battery based on the predicted number of cycles.

10. The method claim 1, further comprising:
classifying the battery as a fresh battery or a used battery based on the predicted number of cycles.

11. An electronic device for managing a battery, the electronic device comprising:
at least one memory storing at least one instruction; and
at least one processor configured to execute the at least one instruction, wherein the at least one instruction, when executed by the at least one processor, causes the electronic device to:
obtain a first plurality of battery parameters with respect to a first charging or discharging cycle of the battery;
obtain a second plurality of battery parameters with respect to a second charging or discharging cycle of the battery;
determine a relative entropy by comparing the first plurality of battery parameters measured during the first charging or discharging cycle and the second plurality of battery parameters measured during the first second charging or discharging cycle; and
predict a number of cycles after which a battery capacity is predicted to drop, based on the determined relative entropy.

12. The electronic device of claim 11, wherein the at least one to generate an assessment result indicative of a health of the battery as a measure of the predicted number of cycles, wherein the health of the battery is defined as at least one of:
a battery lifetime defined by the predicted number of cycles after which the battery capacity is predicted to gradually drop;
a sudden death of the battery predicted based on the determined relative entropy, the sudden death being defined by a predicted severe drop of the battery capacity;
an end of life defined by a predicted cycle of the battery associated with the sudden death; and
a remaining useful life defined by a difference between the end of life and an ongoing cycle of operation of the battery.

13. The electronic device of claim 11, wherein the at least one instruction, when executed by the at least one processor, further causes the electronic device to obtain the first plurality of battery parameters and the second plurality of battery parameters by:
charging or discharging the battery for a first time;
measuring over different points of charging or discharging time, the first plurality of battery parameters;
charging or discharging the battery for a second time; and
measuring over different points of charging or discharging time, the second plurality of battery parameters, and
wherein each of the first plurality of battery parameters and the second plurality of battery parameters comprises at least one of a current, a voltage, and a resistance.

14. The electronic device of claim 11, wherein the at least one instruction, when executed by the at least one processor, further causes the electronic device to predict the number of cycles after which the battery capacity is predicted to drop by:
inputting a value corresponding to the relative entropy into an extrapolation model;
obtaining by the extrapolation model at least one of:
a mean value and a slope of the relative entropy;
a first threshold denoting a nominal transition in the relative entropy from a first linearity to a second linearity based on the mean value and the slope; and
a second threshold denoting an abrupt transition in the relative entropy from the second linearity to non-linearity based on the mean value and the slope; and
extrapolating a variation-pattern observed within the relative entropy based on the first threshold and the second threshold.

15. The electronic device of claim 14, wherein the at least one instruction, when executed by the at least one processor, further causes the electronic device to determine the relative entropy by:
obtaining a first histogram of the battery capacity of the first charging or discharging cycle;
obtaining a second histogram of the battery capacity of the second charging or discharging cycle; and
normalizing the first histogram and the second histogram to compute the relative entropy between the first histogram and the second histogram.

16. The electronic device of claim 14, wherein the at least one instruction, when executed by the at least one processor, further causes the electronic device to:
identify within the extrapolated variation pattern at least one of:
a first charging or discharging cycle point corresponding to the first threshold to denote a pre-alert about a gradual drop of the battery capacity; and
a second charging or discharging cycle point corresponding to the second threshold to denote a danger alert about a severe drop of the battery capacity, the severe drop being defined by a sudden death of the battery.

17. The electronic device of claim 16, wherein the first charging or discharging cycle point corresponds to a point of extrapolated relative entropy exceeding the first threshold for a first time,
wherein the second charging or discharging cycle point corresponds to a point of extrapolated relative entropy exceeding the second threshold for a first time, and
wherein the predicted number of cycles is based on a difference between the first charging or discharging cycle point and the second charging or discharging cycle point.

18. The electronic device of claim 16, wherein the at least one instruction, when executed by the at least one processor further causes the electronic device to output a prior alert and a danger alert at time intervals separated by the predicted number of cycles.

19. The electronic device of claim 18, wherein the at least one instruction, when executed by the at least one processor, further causes the electronic device to:
predict a life time for the battery based on the predicted number of cycles, or
predict a life time for a plurality of applications operating upon a battery power of the battery based on the predicted number of cycles.

20. The electronic device of claim 11, wherein the at least one instruction, when executed by the at least one processor, further causes the electronic device to:

classify the battery as a fresh battery or a used battery based on the predicted number of cycles.

* * * * *